(12) United States Patent
Cho et al.

(10) Patent No.: US 12,181,494 B2
(45) Date of Patent: Dec. 31, 2024

(54) PROBE SHEET WITH CONTACT TIP ON STACKED MULTI-LAYER AND METHOD OF MANUFACTURING THE SAME

(71) Applicants: PROTEC MEMS TECHNOLOGY INC, Asan-si (KR); Yong Ho Cho, Yongin-si (KR)

(72) Inventors: Yong Ho Cho, Yongin-si (KR); Tae Kyun Kim, Seoul (KR)

(73) Assignee: PROTEC MEMS TECHNOLOGY INC, Asan-si (KR)

( * ) Notice: Subject to any disclaimer, the term of this patent is extended or adjusted under 35 U.S.C. 154(b) by 0 days.

(21) Appl. No.: 18/617,675

(22) Filed: Mar. 27, 2024

(65) Prior Publication Data

US 2024/0230717 A1 Jul. 11, 2024

Related U.S. Application Data

(63) Continuation of application No. PCT/KR2023/016437, filed on Oct. 23, 2023.

(30) Foreign Application Priority Data

Dec. 2, 2022 (KR) .......................... 10-2022-0166458

(51) Int. Cl.
*G01R 3/00* (2006.01)
*C23C 14/02* (2006.01)
(Continued)

(52) U.S. Cl.
CPC ........ *G01R 1/06761* (2013.01); *C23C 14/021* (2013.01); *C23C 14/185* (2013.01);
(Continued)

(58) Field of Classification Search
CPC ... C23C 28/023; C23C 18/00; G01R 1/07342; G01R 3/00; H05K 3/205; C25D 3/38;
(Continued)

(56) References Cited

U.S. PATENT DOCUMENTS

| 6,662,442 | B1 * | 12/2003 | Matsui | .................... | H05K 3/205 |
| | | | | | 430/311 |
| 7,534,629 | B2 * | 5/2009 | Shoji | .................... | G01R 1/0735 |
| | | | | | 257/E21.531 |

(Continued)

FOREIGN PATENT DOCUMENTS

| JP | 05-129387 A | 5/1993 |
| JP | 06-040106 B2 | 5/1994 |

(Continued)

*Primary Examiner* — Donghai D Nguyen
(74) *Attorney, Agent, or Firm* — NKL Law; Jae Youn Kim

(57) ABSTRACT

Disclosed are a probe sheet with a multi-layer contact tip and a method of manufacturing the same capable of improving the design freedom of a contact tip formed on a probe sheet of a probe card for testing a semiconductor device to come in contact with a pad of the semiconductor device. According to the present invention, the design freedom of a contact tip formed on a probe sheet of a probe card for testing a semiconductor device to come in contact with a pad of the semiconductor device can be improved, and since the shape of a contact surface of a contact tip is maintained the same and contact resistance is maintained in an allowable range even when a protective layer coated on the contact tip to increase durability of the contact tip is worn, test reliability of the probe card can be improved.

4 Claims, 7 Drawing Sheets

(51) Int. Cl.
  *C23C 14/18*  (2006.01)
  *C23C 14/58*  (2006.01)
  *C23C 28/02*  (2006.01)
  *C25D 3/38*  (2006.01)
  *C25D 7/00*  (2006.01)
  *G01R 1/067*  (2006.01)
  *G01R 1/073*  (2006.01)

(52) U.S. Cl.
  CPC ............ *C23C 14/58* (2013.01); *C23C 28/023* (2013.01); *C25D 3/38* (2013.01); *C25D 7/00* (2013.01); *G01R 1/07342* (2013.01); *G01R 3/00* (2013.01)

(58) Field of Classification Search
  CPC ................ C25D 7/00; Y10T 29/49155; Y10T 29/49204; Y10T 29/49224

See application file for complete search history.

(56) References Cited

U.S. PATENT DOCUMENTS

| | | | |
|---|---|---|---|
| 8,803,539 B2* | 8/2014 | Rathburn | G01R 1/07314 324/755.01 |
| 10,067,162 B2* | 9/2018 | Shi | G01R 3/00 |

FOREIGN PATENT DOCUMENTS

| | | |
|---|---|---|
| JP | 09-203749 A | 8/1997 |
| JP | 2001356135 A | 12/2001 |
| JP | 2002071717 A | 3/2002 |
| JP | 3502874 B2 | 3/2004 |
| JP | 2016125876 A | 7/2016 |
| JP | 2016186484 A | 10/2016 |
| JP | 2019109102 A | 7/2019 |
| KR | 10-2009-0012242 A | 2/2009 |
| KR | 10-2009-0074456 A | 7/2009 |
| KR | 10-2011-0018903 A | 2/2011 |
| KR | 10-2011-0121066 A | 11/2011 |
| KR | 10-2014-0054904 A | 5/2014 |
| KR | 10-2018-0011660 A | 2/2018 |
| KR | 10-2020-0057524 A | 5/2020 |

* cited by examiner

PROBE SHEET WITH CONTACT TIP ON STACKED MULTI-LAYER AND METHOD OF MANUFACTURING THE SAME

This work was supported by the Industrial Strategic Technology Development Program (20010329, Ultra precision and high lamination MLO PCB Developmentfor AP Probe Card) funded by the Ministry of Trade Industry & Energy (MOTIE, Korea).

TECHNICAL FIELD

The present invention relates to a probe sheet with a multi-layer contact tip and a method of manufacturing the same capable of improving the design freedom of a contact tip formed on a probe sheet of a probe card for testing a semiconductor device to come in contact with a pad of the semiconductor device.

BACKGROUND ART

Probe cards are used to test electrical characteristics of semiconductor devices such as radio frequency (RF) communication devices. A probe card is mounted on an external testing apparatus, and a needle supported by a printed circuit board (PCB) comes in contact with a semiconductor device to transmit an electrical signal between the testing apparatus and the semiconductor device. Here, there is a problem in that it is difficult for the needle supported by the probe card to effectively come in contact with semiconductor devices with reduced sizes due to structural characteristics thereof.

As a related art for dealing with such a problem, in Japanese Patent Registration No. 3502874, a contact tip is formed with a hole formed by anisotropic etching of a silicon wafer as a mold material, and a test is conducted by an electrical connection in which the contact tip comes in contact with an electrode of a target to be tested. Since the contact tip is formed in a pyramidal shape that corresponds to the hole formed by anisotropic etching of the silicon wafer, it is difficult for the contact tip to correspond to an electrode of a semiconductor device with a narrow pitch. In the above document, since etching technology referred to as anisotropic etching is inevitably used to form the contact tip that comes in direct contact with the semiconductor device, the design freedom of the shape and length of the contact tip is low.

[Document 1] Japanese Patent Registration No. 3502874 (Date of Registration: Dec. 19, 2003)

DISCLOSURE

Technical Problem

The present invention is directed to providing a probe sheet with a multi-layer contact tip and a method of manufacturing the same capable of improving the design freedom of a contact tip formed on a probe sheet of a probe card for testing a semiconductor device to come in contact with a pad of the semiconductor device and capable of improving test reliability of the probe card by maintaining contact resistance in an allowable range even when a protective layer coated to increase durability of the contact tip is worn.

Technical Solution

The present invention provides a probe sheet with a multi-layer contact tip, the probe sheet including: a ground line layer formed on a flexible substrate; a circuit line layer formed on the flexible substrate separately from the ground line layer; and a multi-layer contact tip having a base bump layer formed on an upper portion of the circuit line layer of the flexible substrate and a plurality of contact tip layers formed to be stacked on an upper portion of the base bump layer.

Also, in the multi-layer contact tip, a first contact tip layer may be formed on the upper portion of the base bump layer, a second contact tip layer may be formed on an upper portion of the first contact tip layer, and a cross-sectional area of the second contact tip layer may be formed smaller than a cross-sectional area of the first contact tip layer.

Also, the first and second contact tip layers may be formed in the shape of a quadrangular column.

Also, the base bump layer and the first and second contact tip layers may be formed of a nickel-cobalt (Ni—Co) alloy layer.

Also, the multi-layer contact tip may include a protective layer coated to protect the plurality of contact tip layers.

Also, the protective layer may be formed of rhodium.

Also, the flexible substrate may be a polyimide layer, and the ground line layer may be a mesh type grounding conductor electrically connected to the circuit line layer.

The present invention provides a method of manufacturing a probe sheet with a multi-layer contact tip, the method including: (a) forming a ground line layer on a flexible substrate; (b) forming a circuit line layer on the flexible substrate separately from the ground line layer; and (c) forming a multi-layer contact tip having a base bump layer and a plurality of contact tip layers on an upper portion of the circuit line layer formed in step (b).

Also, the method may further include (d) forming a protective layer coated on an outer surface of the contact tip layer formed in step (c) to protect the contact tip layer, and the protective layer may be formed of rhodium.

Advantageous Effects

According to embodiments, the design freedom of a contact tip applied to a probe sheet is improved compared to the related art, and thus it is easy to change the shape of the contact tip.

According to embodiments, since a multi-layer contact tip is formed in the final process, and photoresist film etching, electroplating, and molding processes are used to form the contact tip, it is easy to change the shape of the contact tip.

According to embodiments, even when a multi-layer contact tip is worn and a length of the contact tip is decreased with an increase in the number of tests using a probe card, a cross-sectional area of the contact tip can be maintained constant because the contact tip is formed in the shape of a quadrangular column. In this way, since the cross-sectional area of the contact tip is maintained constant, contact resistance of the contact tip that is allowed for product design can be satisfied, and thus test reliability of the probe card can be improved.

MODES OF THE INVENTION

Figure 1A:
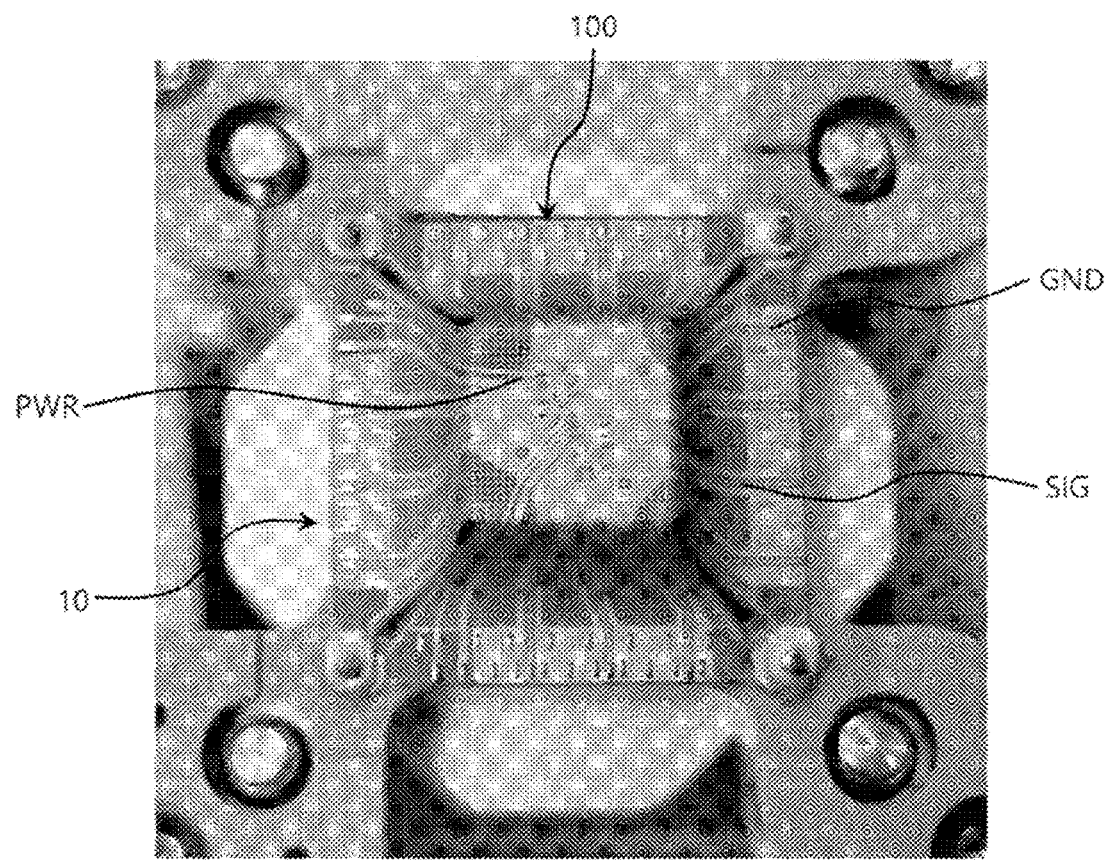
FIG. 1A is an image of a probe card to which a probe sheet with a multi-layer contact tip according to an embodiment of the present invention is coupled.

Hereinafter, the present invention will be described by describing embodiments of the present invention with reference to the accompanying drawings. The same reference numerals presented in each drawing represent the same components. Also, in describing the present invention, when a detailed description of a relevant known function or configuration is determined as having the possibility of unnecessarily obscuring the gist of the present invention, the detailed description thereof will be omitted. Also, when a certain part is described as "including" a certain component, this means that the certain part may further include other components instead of excluding other components unless particularly described otherwise.

A probe card according to the present invention is connected to a testing apparatus and used to test a semiconductor device.

The probe card according to the present invention comes in contact with a pad of a semiconductor device through a multi-layer contact tip, which is formed on a probe sheet, and detects information of the semiconductor device. Here, the probe card may be mounted on an opening formed in a printed circuit board (PCB) and detect information of the semiconductor device. An opening may be formed in the PCB for a probe card to be mounted thereon, and a probe card may be mounted on the corresponding opening.

As illustrated in FIG. 1A, a probe sheet 100 according to an embodiment may be manufactured as a flexible substrate, for example, a flexible polyimide film, and installed on a support portion 10 of a probe card.

A multi-layer contact tip and an electric circuit pattern are formed on the probe sheet 100. The electric circuit pattern includes a ground line GND, a signal line SIG, a power line PWR, and the like.

Figure 1B:
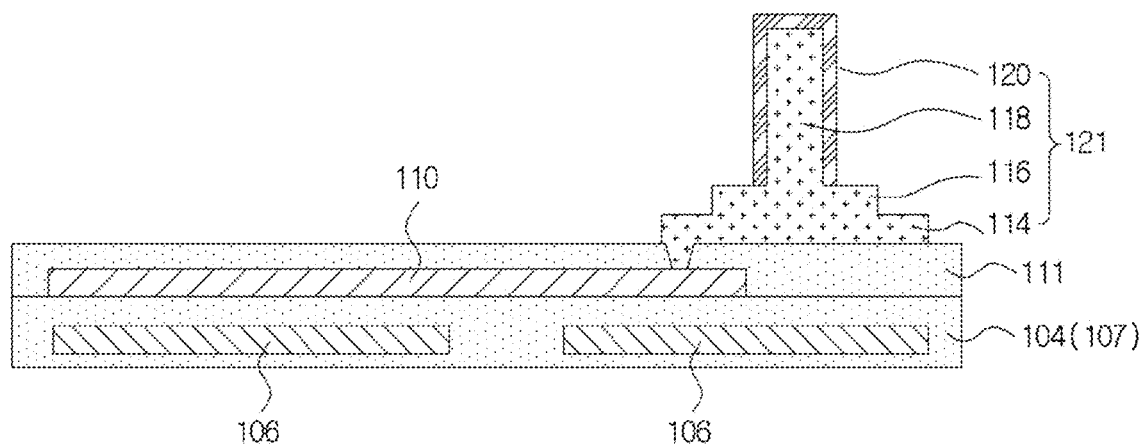
FIG. 1B is a cross-sectional view of the probe sheet with the multi-layer contact tip according to an embodiment of the present invention.
Figure 1C:
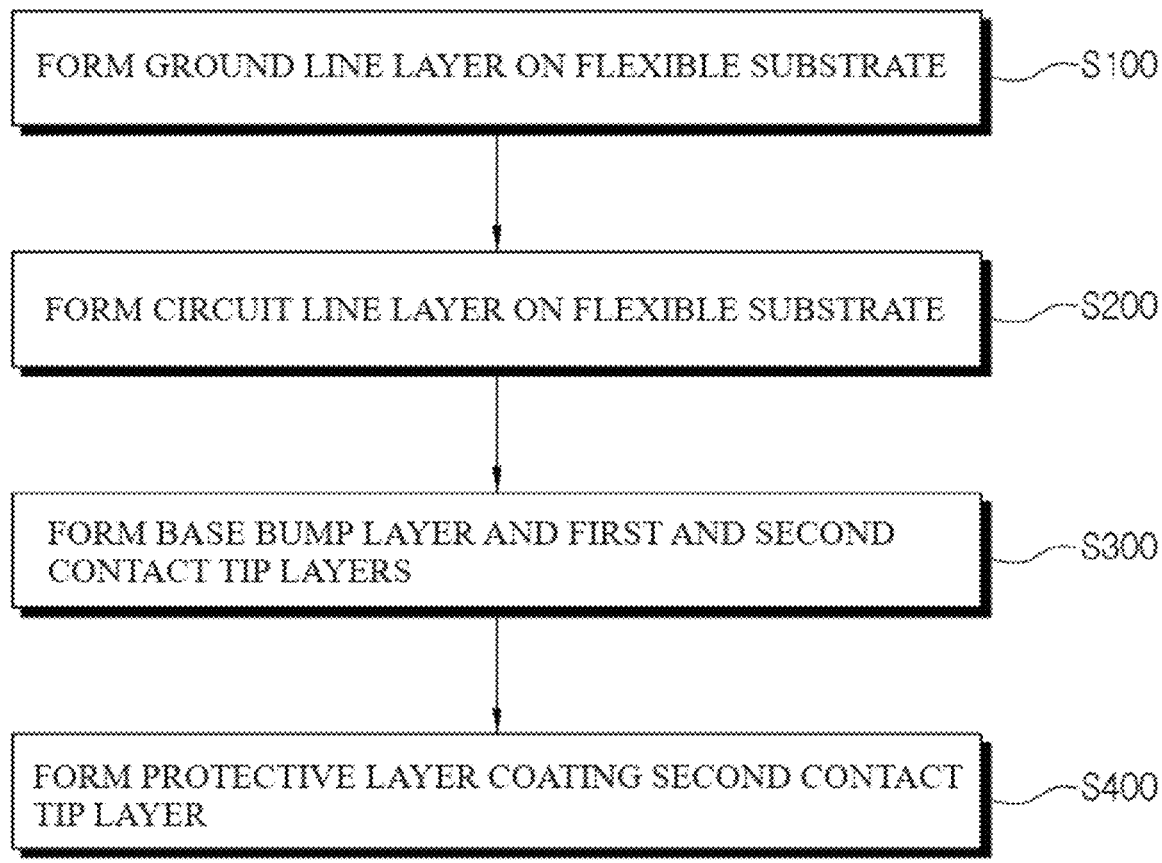
FIG. 1C is a flowchart for describing a method of manufacturing the probe sheet with the multi-layer contact tip according to an embodiment of the present invention.

Referring to FIGS. 1B and 1C, in the probe sheet 100 with a multi-layer contact tip according to an embodiment of the present invention, a ground line layer 106 may be formed on polyimide layers 104 and 107 (S100), a circuit line layer 110 may be formed on a polyimide layer 111 which is at an upper portion of the polyimide layers 104 and 107 (S200), and a multi-layer contact tip 121 formed at an upper portion of the polyimide layer 111 may be exposed (S300).

The circuit line layer 110 may form an electric circuit pattern such as a signal line SIG configured to transmit a test signal, a power line PWR configured to supply power, and a ground line GND. In an embodiment, a mesh type grounding conductor is formed as the ground line layer 106.

The multi-layer contact tip 121 may include a base bump layer 114 electrically connected to the circuit line layer 110 through a via-hole, first and second contact tip layers 116 and 118 sequentially formed on an upper portion of the base bump layer 114, and a protective layer 120 coated on an outer surface of the contact tip layer.

A method of manufacturing the probe sheet will be described with reference to FIGS. 2A to 2K.

Figure 2A:
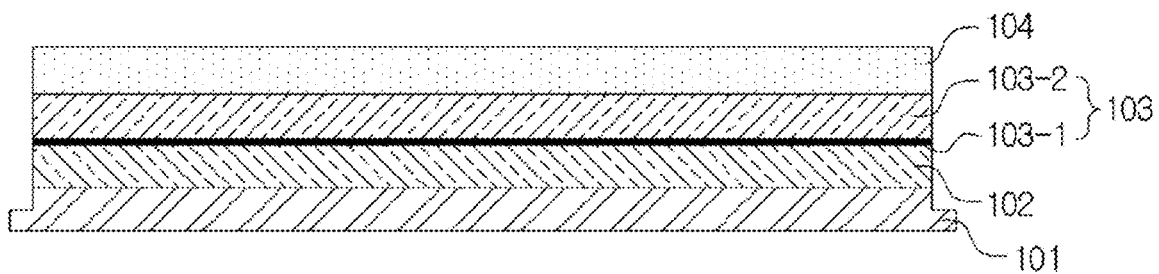
FIGS. 2A to 2K are schematic views sequentially showing a process of manufacturing the probe sheet with the multi-layer contact tip according to an embodiment of the present invention.

As illustrated in FIG. 2A, a base substrate 101 is prepared. An insulating substrate made of ceramic, glass, or the like may be used as the base substrate 101. Here, a process of washing and drying a surface of the base substrate 101 to remove foreign matter or the like attached to the base substrate may be further included.

An upper portion of the base substrate 101 is coated with liquid polyimide, and high-temperature curing is performed to form a polyimide layer 102. For the high-temperature curing, drying and heat treatment are performed using hot air with an atmospheric temperature of 350° C. and a process time of 1 hour.

A seed layer 103 including a titanium/copper (Ti/Cu) layer 103-1 and a Cu layer 103-2 is sequentially formed on an upper portion of the polyimide layer 102. The Ti/Cu layer 103-1 is formed using high-temperature sputtering, the Cu layer 103-2 is formed with a predetermined thickness on an upper portion of the Ti/Cu layer 103-1 using electroplating, and then polishing is performed to smooth the surface.

A polyimide film (PI film) having a thickness of 12.5 μm is laminated on an upper portion of the seed layer 103 in a vacuum atmosphere to form a polyimide layer 104.

Figure 2B:
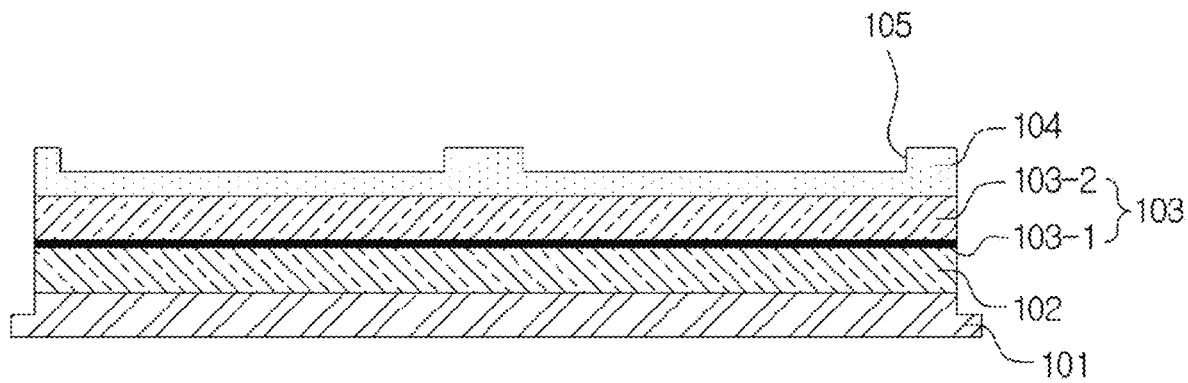

In FIG. 2B, an upper portion of the polyimide layer 104 is removed using an etching solution to form an etching hole 105 that corresponds to the ground line pattern GND.

Figure 2C:
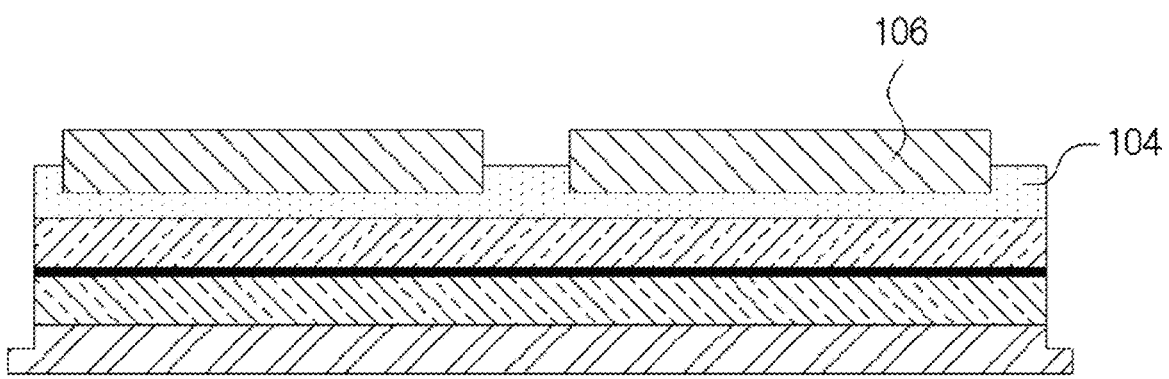
Figure 2D:
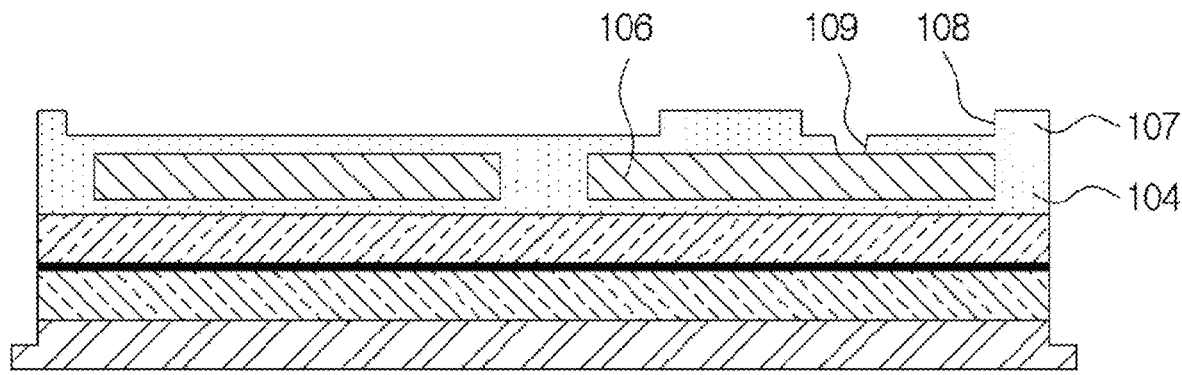

In FIGS. 2C and 2D, the ground line layer 106 that corresponds to the etching hole 105 is formed using a damascene process. In the ground line layer 106, a Ti/Cu layer is formed using high-temperature sputtering, and a Cu layer is formed with a predetermined thickness thereon using electroplating. The polyimide layer 107 is formed on upper portions of the polyimide layer 104 and the ground line layer 106. The formation of the polyimide layer 107 is performed by an adhesion process in which a PI film having a thickness of 25 μm is laminated in a vacuum atmosphere. An etching hole 108 and a connecting hole 109 are formed at an upper portion of the polyimide layer 107. An upper portion of the polyimide layer 107 is removed using an etching solution to form the etching hole 108 that corresponds to a signal line pattern, and the connecting hole 109 is formed by a hole drilling process using a laser.

Figure 2E:
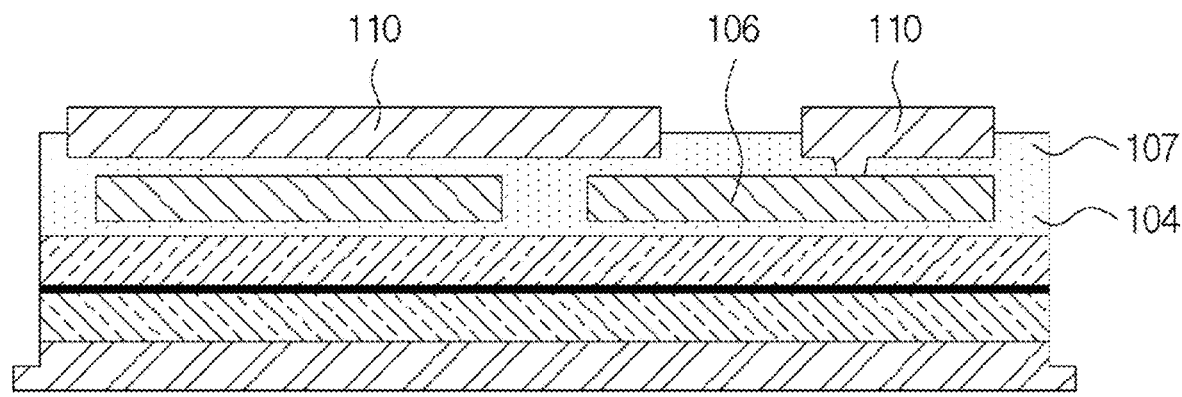

As illustrated in FIG. 2E, the circuit line layer 110 is formed. The circuit line layer 110 is formed by a process in which a Ti/Cu layer is formed using high-temperature sputtering, and a Cu layer is formed with a predetermined thickness thereon using electroplating.

Figure 2F:
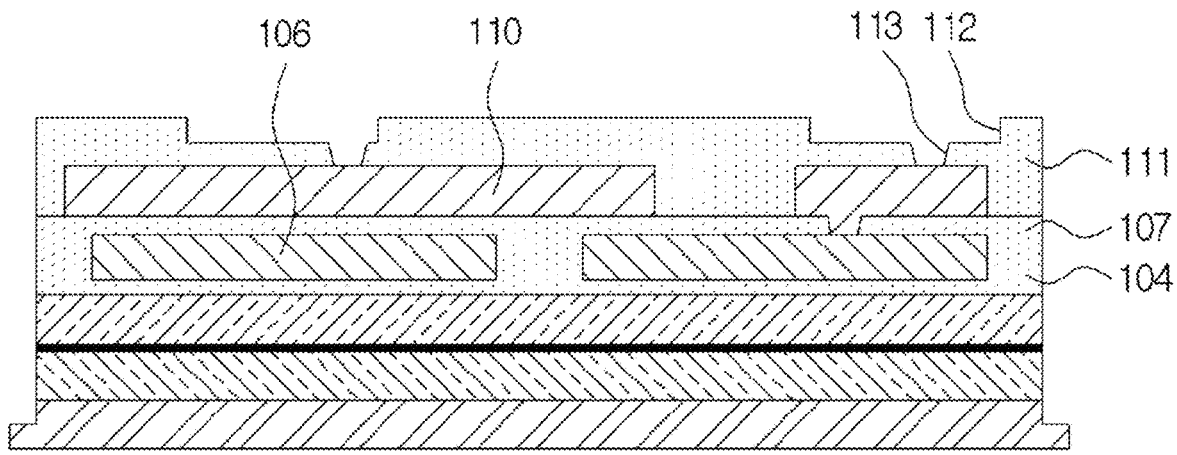

In FIG. 2F, the polyimide layer 111 is formed on upper portions of the polyimide layer 107 and the circuit line layer 110. The formation of the polyimide layer 111 is performed by an adhesion process in which a PI film having a thickness of 25 μm is laminated in a vacuum atmosphere. An etching hole 112 and a connecting hole 113 are formed at an upper portion of the polyimide layer 111. The etching hole 112 is formed, and then the connecting hole 113 is formed.

An upper portion of the polyimide layer 111 is removed using an etching solution to form the etching hole 112 that corresponds to a contact tip pattern, and the connecting hole 113 is formed by a hole drilling process using a laser.

Figure 2G:
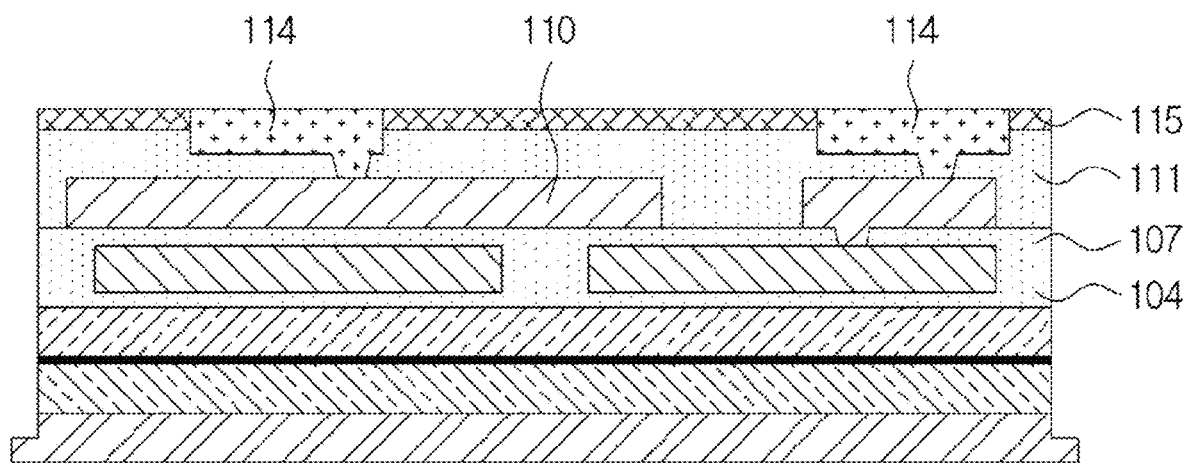

In FIG. 2G, the base bump layer 114 of the contact tip is formed. The formation of the base bump layer 114 includes performing etching on a photoresist film 115 along a base bump pattern, forming a Ti/Cu layer on the etched portion using high-temperature sputtering, forming a Ni—Co alloy layer having a predetermined thickness thereon using electroplating and molding processes, and performing a polishing process of smoothing the surface.

Figure 2H:
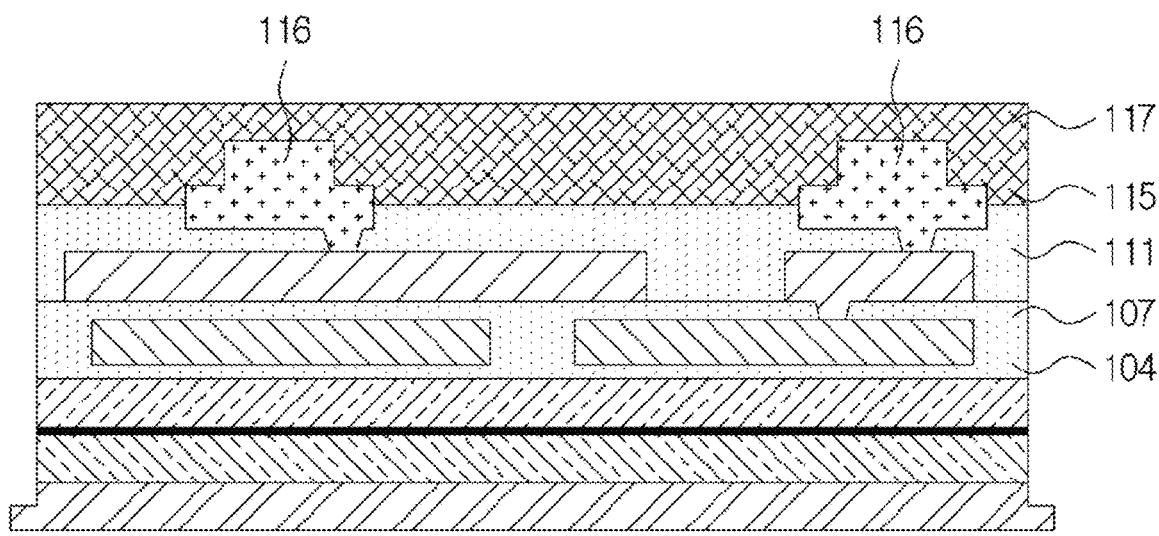

In FIG. 2H, the first contact tip layer 116 is formed. The formation of the first contact tip layer 116 includes performing etching on a photoresist film 117 along a first contact tip pattern, forming a Ni—Co alloy layer having a predetermined thickness on an upper portion of the base bump layer 114, which is exposed due to etching, using electroplating and molding processes, and then performing a polishing process of smoothing the surface. Here, a cross-sectional area of the first contact tip layer 116 is formed smaller than a cross-sectional area of the base bump layer 114.

Figure 2I:
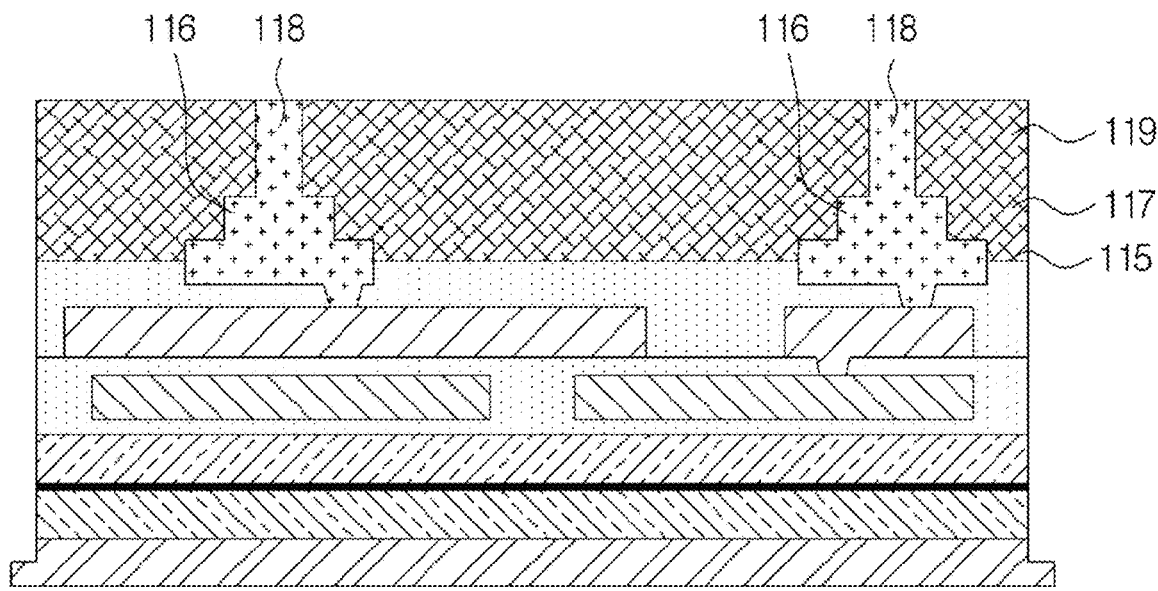

In FIG. 2I, the second contact tip layer 118 is formed. The formation of the second contact tip layer 118 includes performing etching on a photoresist film 119 along a second contact tip pattern, forming a Ni—Co alloy layer having a predetermined thickness on an upper portion of the first contact tip layer 116, which is exposed due to etching, using electroplating and molding processes, and then performing a polishing process of smoothing the surface.

Figure 2J:
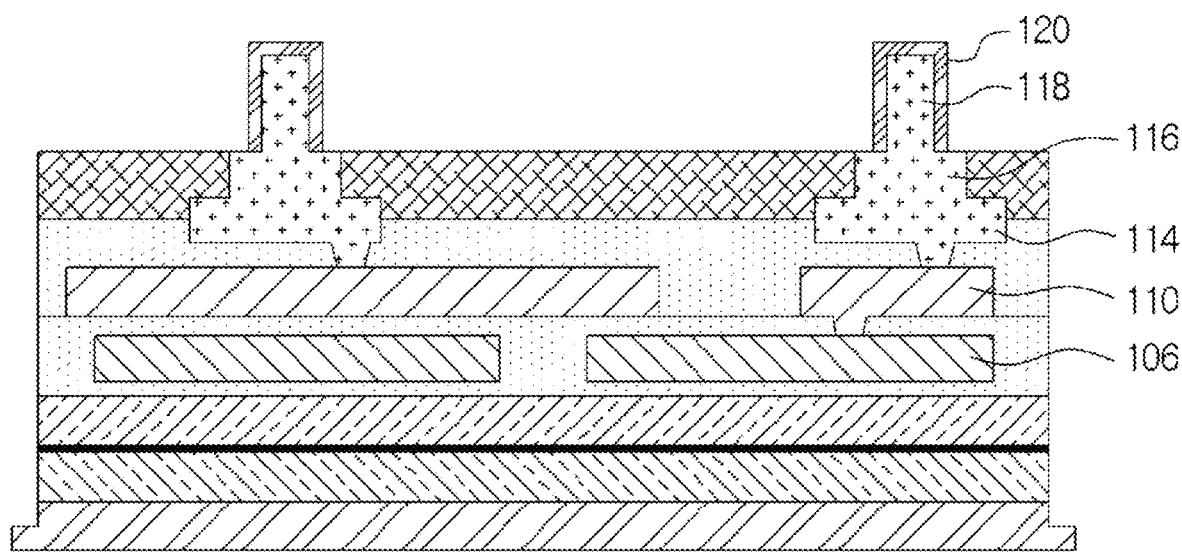

In FIG. 2J, the protective layer 120 is formed. The formation of the protective layer 120 includes forming an etching groove (recess) for coating, etching a portion around the second contact tip layer 118 exposed using the etching groove, and coating the protective layer 120 on an outer surface of the second contact tip layer 118 using electroplating. The protective layer 120 serves to coat and protect the outer surface of the second contact tip layer 118 and may be formed of a material having excellent durability. In an embodiment, the protective layer 120 is formed of rhodium that has high electrical conductivity and durability.

Figure 2K:
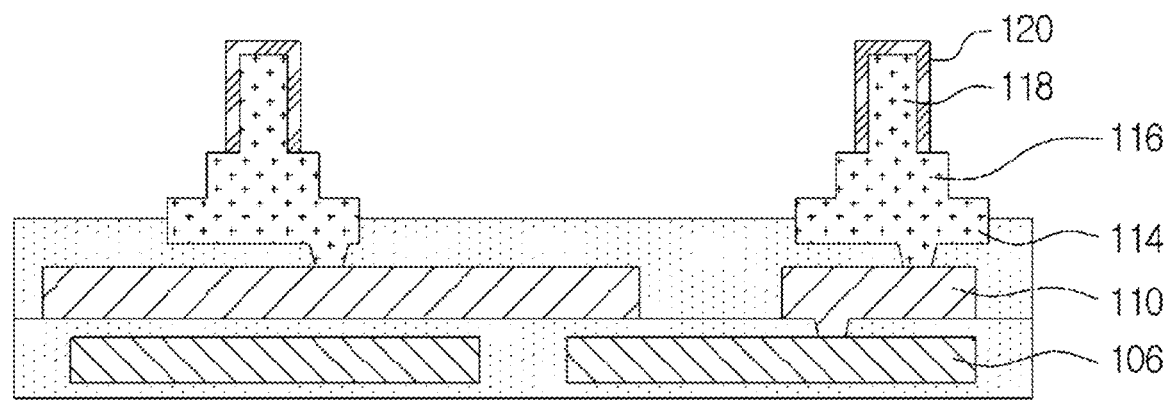

Lastly, as illustrated in FIG. 2K, the probe sheet to be applied to a probe card may be manufactured by removing the base substrate 101, the polyimide layer 102, and the seed layer 103 at the bottom using a laser and removing the photoresist films 115 and 117 at the top through a stripping process.

Figure 3:
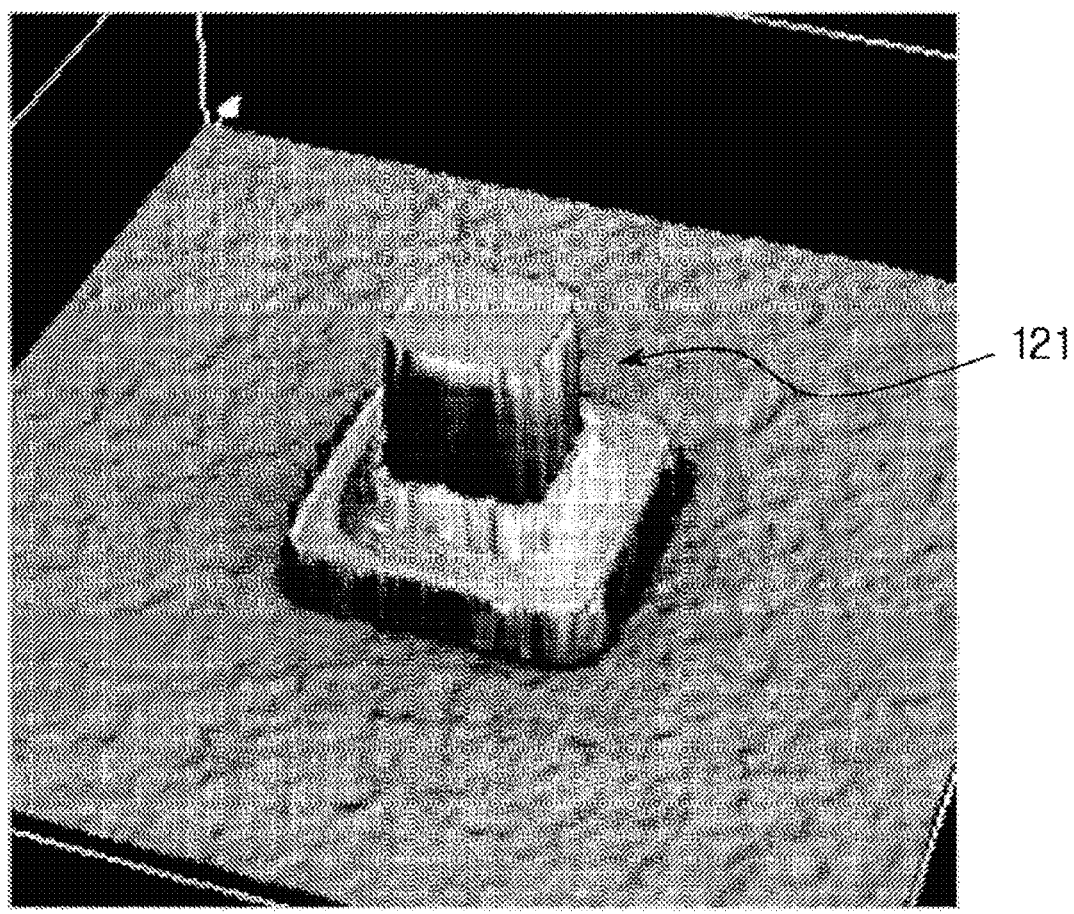
FIG. 3 is an image of the multi-layer contact tip according to an embodiment of the present invention.

Referring to FIG. 3, the multi-layer contact tip 121 according to an embodiment of the present invention is formed by the first and second contact tip layers 116 and 118 with narrowing cross-sectional areas being formed in a stair shape on an upper portion of the base bump layer 114 and the protective layer 120 being coated on the second contact tip layer 118. The first contact tip layer 116 and the second contact tip layer 118 are formed in the shape of a quadrangular column, and the cross-sectional area of the second contact tip layer 118 is formed smaller than the cross-sectional area of the first contact tip layer 116.

According to an embodiment, by carrying out a performance test for various shapes of contact tips, a contact tip shape profile suitable for a semiconductor device to be tested can be easily obtained.

According to an embodiment, even when a multi-layer contact tip is worn and a length thereof is decreased during use of a probe card, a cross-sectional area of the contact tip formed in the shape of a quadrangular column can be maintained constant. Such a wear characteristic of the contact tip can be confirmed through a constant shape of contact marks formed on a semiconductor device pressed by the contact tip through repeated tests using the probe card. Since the cross-sectional area of the contact tip worn in this way is constant, contact resistance of the contact tip that is allowed for product design can be continuously satisfied, and thus test reliability of the probe card can be improved.

According to an embodiment, since a process of forming a coating layer on a surface of a contact tip using electroplating is applied, even when a thickness of rhodium is different according to various requirements of a target to be tested, rhodium can be formed with a desired thickness by changing process conditions.

The above-given description of the present invention is only illustrative, and those of ordinary skill in the art to which the present invention pertains should understand that the present invention can be easily modified to other specific forms without changing the technical spirit or essential features of the present invention.

INDUSTRIAL APPLICABILITY

Electrical characteristics of semiconductor devices such as a radio frequency (RF) communication device can be stably tested using a probe card on which a probe sheet with a multi-layer contact tip according to the present invention is mounted.

The invention claimed is:

1. A probe sheet with a multi-layer contact tip, the probe sheet comprising:
    a seed layer formed on an upper portion of a polyimide layer of a base substrate;
    a first polyimide layer formed by laminating a polyimide film on an upper portion of the seed layer in a vacuum atmosphere and having a first etching hole formed on a film surface thereof;
    a ground line layer formed by forming a titanium/copper (Ti/Cu) layer on the etching hole using high-temperature sputtering and forming a Cu layer with a predetermined thickness thereon using electroplating;
    a second polyimide layer formed by laminating a polyimide film on upper portions of the first polyimide layer and the ground line layer in a vacuum atmosphere and having a second etching hole and a connecting hole formed on a film surface thereof;
    a circuit line layer formed by forming a Ti/Cu layer on the second etching hole using high-temperature sputtering and forming a Cu layer with a predetermined thickness thereon using electroplating and connected to the ground line layer through the connecting hole;
    a third polyimide layer formed by laminating a polyimide film on upper portions of the second polyimide layer and the circuit line layer in a vacuum atmosphere and having a third etching hole and a connecting hole formed on a film surface;
    a base bump layer formed by forming a Ti/Cu layer on the third etching hole using high-temperature sputtering and forming a nickel-cobalt (Ni—Co) alloy layer with a predetermined thickness thereon using electroplating and molding processes;
    a first contact tip layer formed by forming a Ni—Co alloy layer with a predetermined thickness on an upper portion of the base bump layer;
    a second contact tip layer formed by forming a Ni—Co alloy layer with a predetermined thickness on an upper portion of the first contact tip layer; and
    a protective layer formed by etching a portion around the second contact tip layer exposed using an etching groove for coating the second contact tip layer and coating an outer surface of the second contact tip layer with rhodium using electroplating.

2. The probe sheet of claim 1, wherein:
    a cross-sectional area of the second contact tip layer is formed smaller than a cross-sectional area of the first contact tip layer; and the cross-sectional area of the first contact tip layer is formed smaller than a cross-sectional area of the base bump layer.

3. The probe sheet of claim 2, wherein the first and second contact tip layers are formed in the shape of a quadrangular column.

4. A method of manufacturing a probe sheet with a multi-layer contact tip, the method comprising:
   (a) forming a seed layer including a titanium/copper (Ti/Cu) layer and a Cu layer on an upper portion of a polyimide layer of a base substrate;
   (b) laminating a polyimide film on an upper portion of the seed layer, which is formed in step (a), in a vacuum atmosphere to form a first polyimide layer and forming an etching hole on a film surface thereof;
   (c) forming a ground line layer by a process of forming a Ti/Cu layer on the etching hole using high-temperature sputtering and forming a Cu layer with a predetermined thickness thereon using electroplating;
   (d) laminating a polyimide film on upper portions of the first polyimide layer and the ground line layer in a vacuum atmosphere to form a second polyimide layer and forming an etching hole and a connecting hole on a film surface thereof;
   (e) forming a circuit line layer by a process of forming a Ti/Cu layer on the etching hole using high-temperature sputtering and forming a Cu layer with a predetermined thickness thereon using electroplating;
   (f) laminating a polyimide film on upper portions of the second polyimide layer and the circuit line layer in a vacuum atmosphere to form a third polyimide layer and forming an etching hole and a connecting hole on a film surface thereof;
   (g) forming a base bump layer by a process of forming a Ti/Cu layer on the etching hole using high-temperature sputtering and forming a nickel-cobalt (Ni—Co) alloy layer with a predetermined thickness thereon using electroplating and molding processes;
   (h) forming a first contact tip layer as a Ni—Co alloy layer with a predetermined thickness on an upper portion of the base bump layer;
   (i) forming a second contact tip layer as a Ni—Co alloy layer with a predetermined thickness on an upper portion of the first contact tip layer;
   (j) forming a protective layer by etching a portion around the second contact tip layer exposed using an etching groove for coating the second contact tip layer and coating an outer surface of the second contact tip layer with rhodium using electroplating; and
   (k) removing the base substrate, the polyimide layer, and the seed layer at the bottom using a laser.

* * * * *